United States Patent [19]

Moghe et al.

[11] Patent Number: 5,051,705
[45] Date of Patent: Sep. 24, 1991

[54] GAIN-TILT AMPLIFIER

[75] Inventors: Sanjay B. Moghe, Hoffman Estate, Ill.; Ravi Ramachandran, San Jose, Calif.; Finbarr J. McGrath, Burlington, Mass.; Robert D. Genin, San Jose, Calif.

[73] Assignee: Pacific Monolithics, Sunnyvale, Calif.

[21] Appl. No.: 551,426

[22] Filed: Jul. 10, 1990

[51] Int. Cl.⁵ .............................................. H03F 1/34
[52] U.S. Cl. ................................... 330/277; 330/282; 330/294
[58] Field of Search .................. 330/86, 277, 282, 294

[56] References Cited

U.S. PATENT DOCUMENTS 4,612,514  9/1986  Shigaki et al. .................. 330/282 X

FOREIGN PATENT DOCUMENTS 82519  6/1980  Japan .................................. 330/282

OTHER PUBLICATIONS

Pacific Monolithics, Gallium Arsenide Systems, Data Sheet, "2-6 and 2-8 GHz MMIC Amplifiers In Drop-In Packages", 4 pages.
Pacific Monolithics Invention Disclosure Form dated 1/12/89, 13 pages.

*Primary Examiner*—James B. Mullins
*Attorney, Agent, or Firm*—Edward B. Anderson

[57] ABSTRACT

A feedback circuit couples a base amplifier output to the amplifier input for feeding back a portion of an amplified input signal. The feedback circuit includes an inductor coupled in series with a variable resistance. The variable feedback resistance is provided by a feedback FET having a gate for receiving a control signal for varying the resistance between the source and drain. The gain of the base amplifier is determined over the predetermined frequency range by the combined impedance of the inductor and resistance. The base amplifier is a field-effect transistor (FET). The feedback inductance is taken from a portion of a coil coupling the drain of the base FET with an output terminal.

1 Claim, 1 Drawing Sheet

GAIN-TILT AMPLIFIER

FIELD OF THE INVENTION

This invention relates to amplifiers, and particularly to amplifiers controllable for varying the tilt of the gain response across a frequency band.

BACKGROUND AND SUMMARY OF THE INVENTION

A gain tilt amplifier is useful in microwave and other communication systems for providing a gain response with a tilt that can be varied across a frequency band. This is particularly valuable if the amplifier can be realized in monolithic or MIC form. This allows an overall complex circuit to be electronically tuned after construction to meet tight gain flatness specifications. It is particularly desirable to have such an amplifier that has minimal effect on circuit noise and power output.

These features are provided in the present invention by providing a variable feedback impedance for a base amplifier. In particular, such a gain tilt amplifier circuit includes a base amplifier connected between an input terminal, for receiving the input signal, and an output terminal for transmitting the amplified input signal.

A feedback circuit couples the base amplifier output to the amplifier input for feeding back a portion of the amplified input signal to the input. The feedback circuit includes an inductor coupled in series with a variable resistance. The variable resistance is responsive to the control signal for producing a resistance determined by the control signal. The gain of the base amplifier is determined over the predetermined frequency range by the impedances of the inductor and resistance.

In the preferred embodiment of the invention, the base amplifier is a base field-effect transistor (FET). The feedback inductance is taken from a portion of a coil coupling the drain of the base FET with the output terminal. The variable feedback resistance is provided by a feedback FET having a gate for receiving a control signal for varying the resistance between the source and drain of the feedback FET. To increase linearity, a resistor is connected between the drain and source of the feedback FET.

Thus, the feedback impedance, and therefore amplifier gain, is variable. Additionally, the feedback inductance varies the overall feedback impedance with frequency, producing higher impedance at higher frequencies. The relationship between the inductance and resistance in the feedback circuit determines the tilt of the overall gain response.

These and other features and advantages of the present invention will be apparent from the following detailed description of the preferred embodiment and associated drawings.

DETAILED DESCRIPTION OF THE PREFERRED EMBODIMENT

Figure 1:
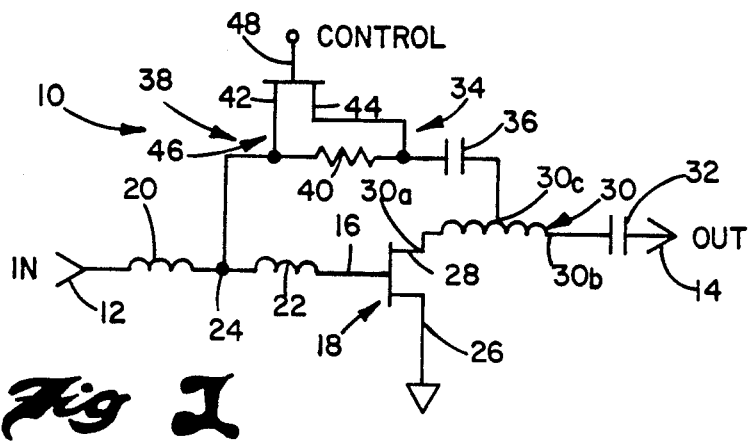
FIG. 1 is a schematic of a gain-tilt-amplifier circuit made according to the invention.

Referring initially to FIG. 1, a gain-tilt-amplifier circuit 10 made according to the invention is shown. Circuit 10 includes an input terminal 12 and an output terminal 14 that couple the circuit to external circuits in a communication system.

Input terminal 12 is coupled to a gate 16 of a first or base FET 18, also referred to as amplifier means. A pair of inductors 20 and 22 are connected together at a node 24, and are connected in series between terminal 12 and gate 16. FET 18 also has a common source 26 and a drain 28 coupled to output terminal 14 via the series connection of a third inductor 30 and a DC blocking capacitor 32. Inductor 30 is preferably a transformer coil having ends 30a and 30b, as shown, and an intermediate tap 30c.

A feedback circuit, shown generally at 34, includes a series connection of a capacitor 36 and a resistance 38. Capacitor 36 prevents the feedback circuit from affecting the DC biasing of amplifier FET 18. Circuit 34 also includes the portion of inductor 30 between end 30a and intermediate tap 30c, to which capacitor 36 is connected. Resistance 38 includes a resistor 40 connected between the source 42 and drain 44 of a feedback FET 46. The gate 48 of FET 46 receives a control signal for varying the resistance between the source and the drain. The parallel connection of resistor 40 with FET 46 provides improved linearity, or more constant slope, of the gain over the applicable frequency range.

Figure 2:
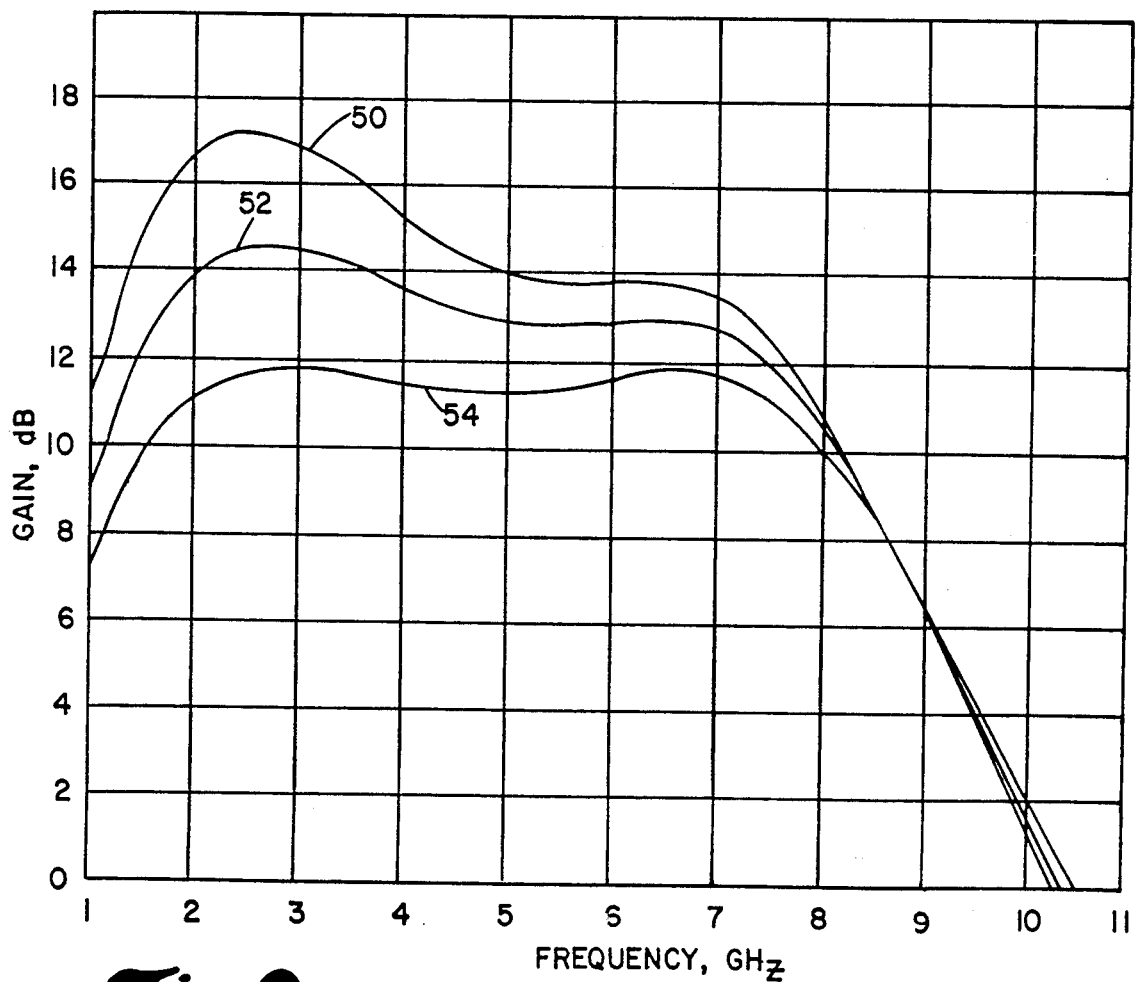
FIG. 2 is a graph showing variations in the gain response of the circuit of FIG. 1 over a frequency range as determined by different control voltages.

FIG. 2 shows the gain of circuit 10 over a frequency range of 10GHz. Upper curve 50 shows the response when a control signal having a voltage of 10 volts is applied to the gate of feedback FET 46. This curve can be seen to have a relatively steep negative slope over a substantial band of the frequency spectrum shown.

Intermediate curve 52 illustrates the gain response resulting from the application of an 11 volt control signal to FET 46. This curve is still negative but with less slope over the operating frequency range of about 2GHz to 7GHz than curve 50.

Lower curve 54 has essentially no slope over the operating frequency range, yet provides almost 12 dB of amplification of the signal input on terminal 12. This curve is the result when 12 volts is applied to the gate of FET 46. This response is useful as a base amplifier if it turns out that a negative tilt, as provided by curves 50 and 52, is undesirable in the completed system.

It will be appreciated that tilt control by a controllable frequency-dependent impedance in the feedback circuit inserts a minimal amount of noise to the overall circuit compared with an equivalent amplifier with flat gain over the frequency range. Further, the output power capability of the circuit is affected minimally in the present configuration. Thus, the present invention provides an electronically controllable gain-tilt feature that has minimal impact on the noise-figure and the power capability of the amplifier. It can also be used to compensate for changes in circuit frequency response due to changes in temperature. It is usable in any stage of a communication system, even in totem pole schemes, without affecting the D.C. bias condition.

It will be apparent to one skilled in the art that variations in form and detail may be made in the preferred embodiment without varying from the spirit and scope of the invention as defined in the claims. For instance, inductor 30 could also be an inductor positioned only in the feedback current path. Other forms of controllable variable resistors may also be used, as well as other devices that could replace FET 18, including GaAs (Gallium Arsenide) MESFET (Metal Semiconductor FET) and HEMT (High Electron Mobility Transistor)

devices. This technique can also be applied to other frequency bands where a feedback approach is applicable. The preferred embodiment is thus provided for purposes of explanation and illustration, but not limitation.

We claim:

1. A gain-tilt amplifier circuit responsive to a control signal for varying the slope of gain applied to an input signal over a predetermined frequency range, the circuit comprising:

an input terminal for receiving the input signal;

an output terminal for transmitting the amplified input signal;

first field-effect-transistor (FET) means for amplifying the input signal, the first FET means having a gate, a common source, and a drain;

first and second inductor means connected in series between the input terminal and the gate of the first FET means, the first and second inductor means being connected together at a node;

inductor coil means having a first end connected to the drain of the first FET means and a second end coupled to the output terminal;

capacitor means;

second FET means having a gate for receiving the control signal, and a source and drain;

resistor means connected between the source and drain of the second FET means;

the capacitor means and resistor means being connected in series between the node between the first and second inductor means and the coil means at a point intermediate the ends of the coil means, whereby a portion of the coil means, the capacitor means, the second FET means and the resistor means form a feedback path having an impedance that is higher at higher input signal frequencies and produces a gain in the input signal that varies over the predetermined frequency range with a slope determined by the control signal.

* * * * *